(12) United States Patent
Krymski

(10) Patent No.: US 8,698,061 B2
(45) Date of Patent: Apr. 15, 2014

(54) IMAGE SENSORS, METHODS, AND PIXELS WITH STORAGE AND TRANSFER GATES

(75) Inventor: Alexander Krymski, Pasadena, CA (US)

(73) Assignee: Luxima Technology LLC, Pasadena, CA (US)

(*) Notice: Subject to any disclaimer, the term of this patent is extended or adjusted under 35 U.S.C. 154(b) by 596 days.

(21) Appl. No.: 12/963,566

(22) Filed: Dec. 8, 2010

(65) Prior Publication Data
US 2011/0139963 A1   Jun. 16, 2011

Related U.S. Application Data

(60) Provisional application No. 61/285,457, filed on Dec. 10, 2009.

(51) Int. Cl.
*H01L 27/00* (2006.01)

(52) U.S. Cl.
USPC ............. 250/208.1; 250/214.1; 257/444; 257/445; 348/308; 348/314

(58) Field of Classification Search
USPC ............ 250/208.1, 214.1; 257/444–445; 348/308, 314
See application file for complete search history.

(56) References Cited

U.S. PATENT DOCUMENTS

| | | |
|---|---|---|
| 3,758,794 A | 9/1973 | Kosonocky |
| 4,309,624 A | 1/1982 | Hynecek et al. |
| 5,541,402 A | 7/1996 | Ackland et al. |
| 5,949,483 A * | 9/1999 | Fossum et al. ............... 348/303 |
| 7,443,437 B2 | 10/2008 | Altice, Jr. et al. |
| 2004/0051801 A1* | 3/2004 | Iizuka et al. ................. 348/294 |
| 2007/0272828 A1* | 11/2007 | Xu ............................... 250/208.1 |
| 2010/0128157 A1* | 5/2010 | Panicacci .................... 348/308 |

OTHER PUBLICATIONS

Nakamura et al., "CMOS Active Pixel Image Sensor with Simple Floating Gate Pixels," IEEE Transactions on Electron Devices, vol. 42, No. 9, Sep. 1995, pp. 1693-1694.

* cited by examiner

*Primary Examiner* — Georgia Y Epps
*Assistant Examiner* — Kevin Wyatt
(74) *Attorney, Agent, or Firm* — Foley & Lardner LLP

(57) ABSTRACT

An image sensor includes a pixel array with a plurality of pixels. A pixel includes a photodiode, a first transfer gate, a storage gate, and a second transfer gate. The first transfer gate is controllable to transfer charge from the photodiode to under the storage gate. The storage gate is connected to a readout circuit to allow the readout circuit to read out a voltage level of a potential at the storage gate. The second transfer gate is controllable to transfer charge from under the storage gate. A method includes controlling the first transfer gate to transfer charge from the photodiode to under the storage gate, reading out a voltage level of a potential at the storage gate using the readout circuit that is connected to the storage gate, and controlling the second transfer gate to drain charge from under the storage gate.

22 Claims, 5 Drawing Sheets ously. In various embodiments, the gap implant includes arsenic

IMAGE SENSORS, METHODS, AND PIXELS WITH STORAGE AND TRANSFER GATES

CROSS-REFERENCE TO RELATED PATENT APPLICATIONS

This application claims the benefit of U.S. Provisional App. Ser. No. 61/285,457, entitled "Shutter Pixel with Floating Gate Storage and Readout and Image Sensors with Shutter Pixels," filed Dec. 10, 2009, the entire contents of which are incorporated by reference herein.

BACKGROUND OF THE INVENTION

1. Field of the Invention

Embodiments of the present invention relate generally to image sensors, pixels, and methods and, in specific embodiments, to a pixel having a structure allowing for charge storage and readout.

2. Related Art

Various types of image sensors and pixels are discussed in U.S. Pat. No. 7,443,437, entitled "Image Sensor with a Gated Storage Node Linked to Transfer Gate," which issued on Oct. 28, 2008, the entire contents of which are incorporated by reference herein, and which is hereinafter referred to as the '437 patent. In particular, FIG. 2 of the '437 patent illustrates a pixel with a photodiode, a shutter gate, and a transfer gate. In that pixel, a barrier region and a storage node are implemented under the shutter gate, with the barrier region under a portion of the shutter gate adjacent to the photodiode to create a barrier, and the storage node under another portion of the shutter gate to create a potential well for storage. One of the drawbacks of such a pixel structure might be a leakage of photoelectrons into the storage node, which is very close to a buried channel depleted area of the photodiode.

SUMMARY OF THE DISCLOSURE

A pixel in accordance with an embodiment of the present invention includes a photodiode, a first transfer gate, a storage gate, and a second transfer gate. The first transfer gate is controllable to transfer charge from the photodiode to under the storage gate. The storage gate is connected to a readout circuit to allow the readout circuit to read out a voltage level of a potential at the storage gate. The second transfer gate is controllable to transfer charge from under the storage gate.

In various embodiments, the storage gate is located between the first transfer gate and the second transfer gate. Also, in various embodiments, the storage gate is charge coupled to the first transfer gate and is charge coupled to the second transfer gate. In some embodiments, the readout circuit includes a source follower transistor. Also, in some embodiments, the storage gate is directly connected to a gate of the source follower transistor. In further embodiments, the readout circuit includes a read select transistor that is connected between the source follower transistor and a readout line and that has a gate connected to receive a row select signal.

In various embodiments, the pixel includes a drain diffusion to which charge is drainable from under the storage gate by the second transfer gate. Also, in various embodiments, the pixel includes a reset transistor that is connected between a reset voltage source and the storage gate and that has a gate connected to receive a reset control signal. In some embodiments, the pixel includes an anti-blooming gate for draining charge from the photodiode into a drain diffusion. Also, in some embodiments, the anti-blooming gate is located on an opposite side of the photodiode relative to the first transfer gate.

In various embodiments, the pixel includes a substrate on which is the first transfer gate, the storage gate, and the second transfer gate. In some embodiments, the first transfer gate is connected to receive a first transfer control signal and the second transfer gate is connected to receive a second transfer control signal. Also, in some embodiments, the second transfer gate is located on an opposite side of the storage gate relative to the first transfer gate.

In various embodiments, the storage gate, the first transfer gate, and the second transfer gate are polysilicon gates that are in a single polysilicon level. Also, in various embodiments, the pixel includes a series of surface BF2 implants on a substrate. In such embodiments, one surface BF2 implant is done as a blanket implant before Poly deposition, and it covers the area of the photodiode, the first and the second transfer gates, as well as the storage gate. A second BF2 implant is also done before Poly deposition and it covers the photodiode and a portion of area under the first transfer gate. A third BF2 implant is done after Poly formation and it covers the photodiode area only.

In various embodiments, the photodiode area is implanted with an arsenic implant to form a buried photodiode. Further, in some embodiments, the pixel includes a blanket arsenic buried channel implant on a substrate, which is done before Poly deposition and which covers the areas of the photodiode, the first and the second transfer gates, as well as the storage gate area. Also, in some embodiments, the photodiode includes a backside boron implant to increase the charge capacity of the photodiode.

In various embodiments, the pixel includes a standard Pwell implant or series of Pwell implants covering the storage area to reduce the leakage of a photocurrent from the substrate into the area under the storage gate, thereby increasing the shutter efficiency. Another function of Pwell implants is to perform pixel-to-pixel isolation and crosstalk reduction.

In some embodiments, the blanket surface BF2 implant and the blanket arsenic implant are not implemented, thereby the storage gate performs as a surface channel storage. Also, in various embodiments, the pixel includes a gap implant on both sides of the storage gate, between the storage gate and the first transfer gate, and between the storage gate and the second transfer gate, where the gap implant includes arsenic or boron. The purpose of the gap implant is to reduce the potential barrier in the substrate between the gates.

A method in accordance with an embodiment of the present invention includes controlling a first transfer gate to transfer charge from a photodiode to under a storage gate, reading out a voltage level of a potential at the storage gate using a readout circuit that is connected to the storage gate, and controlling a second transfer gate to drain charge from under the storage gate. In various embodiments, the method further includes controlling an anti-blooming gate to drain charge from the photodiode, where the anti-blooming gate is located on an opposite side of the photodiode relative to the first transfer gate.

In various embodiments, charge transferred to under the storage gate from the photodiode is stored under the storage gate during the reading out of the voltage level of the potential at the storage gate. Also, in various embodiments, the method includes reading out another voltage level of another potential at the storage gate using the readout circuit after controlling the second transfer gate to drain charge from under the storage gate. In some embodiments, charge from under the storage gate is transferred directly though a channel under the second transfer gate to a drain diffusion during the controlling of the second transfer gate to drain charge from under the storage gate. Also, in some embodiments, the method includes reading out another voltage level of another potential at another storage gate using the readout circuit.

An image sensor in accordance with an embodiment of the present invention includes a pixel array that has a plurality of pixels. In various embodiments, each pixel of the plurality of pixels includes a photodiode, a storage gate, a first transfer gate controllable to transfer charge from the photodiode to under the storage gate, and a second transfer gate controllable to transfer charge from under the storage gate. Also, in various embodiments, each storage gate of each pixel is connected to a corresponding readout circuit to allow the corresponding readout circuit to read out a voltage level of a potential at the storage gate. In some embodiments, the respective storage gates of two or more of the plurality of pixels are directly connected to a same readout circuit.

DETAILED DESCRIPTION OF PREFERRED EMBODIMENTS

Figure 1:
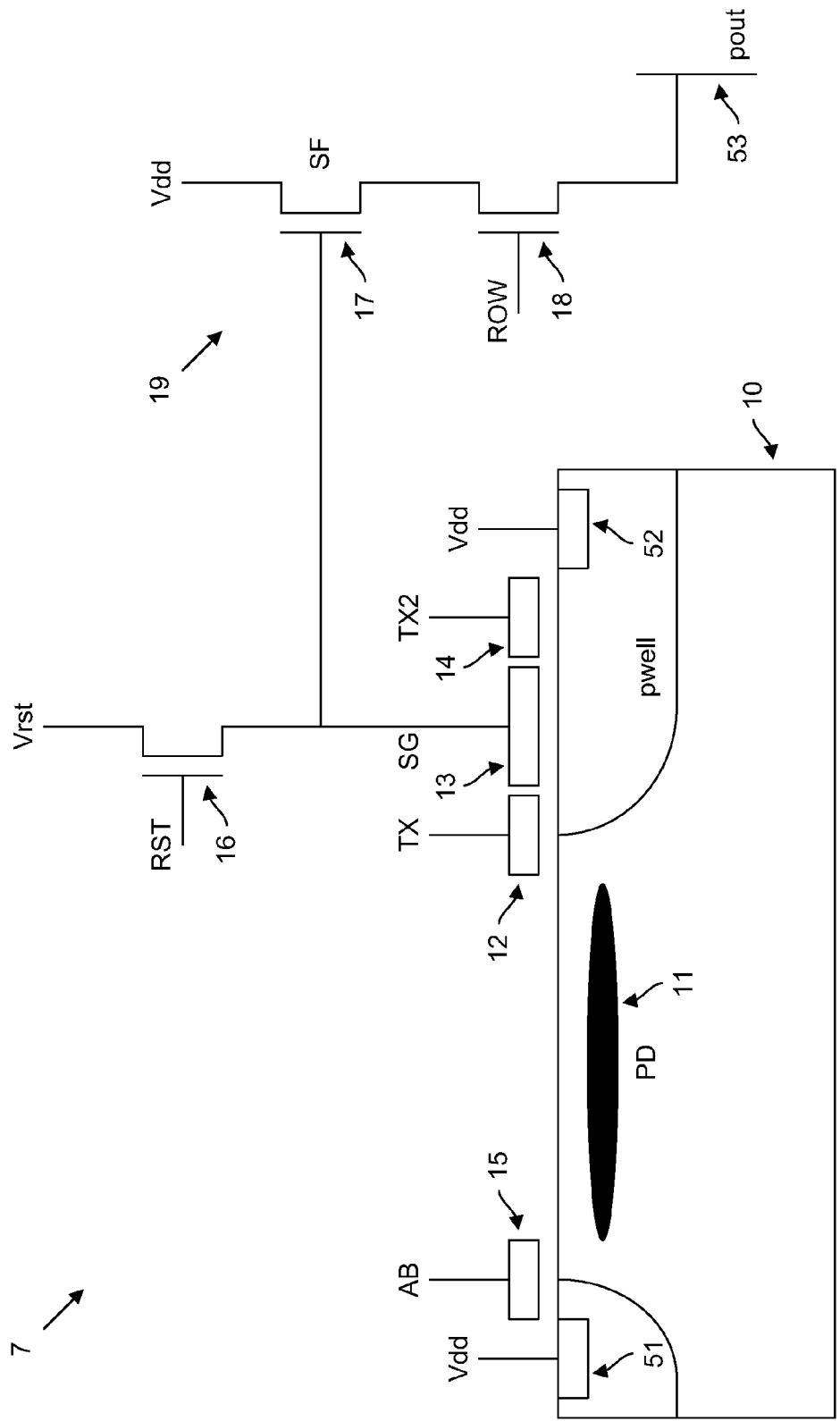
FIG. 1 illustrates a pixel in accordance with an embodiment of the present invention.

FIG. 1 illustrates a pixel 7 in accordance with an embodiment of the present invention. The pixel 7 comprises a substrate 10, a photodiode (PD) 11, a first transfer gate 12, a storage gate 13, a second transfer gate 14, an anti-blooming gate 15, a drain diffusion 51, a drain diffusion 52, a reset transistor 16, and a readout circuit 19. The readout circuit 19 comprises a source follower transistor (SF) 17 and a read select transistor 18. The readout circuit 19 is connected to a readout line 53 for outputting signals from the pixel 7. The photodiode 11 is sensitive to light and can provide charge in response to light.

The first transfer gate 12 is connected to receive a first transfer control signal (TX), and the first transfer gate 12 is controllable by the first transfer control signal TX to transfer charge from the photodiode 11 to under the storage gate 13. The second transfer gate 14 is connected to receive a second transfer control signal (TX2), and the second transfer gate 14 is controllable by the second transfer control signal TX2 to transfer charge from under the storage gate 13 to the drain diffusion 52, such that charge is drainable from under the storage gate 13 to the drain diffusion 52 by operation of the second transfer gate 14. The storage gate 13 is connected to the readout circuit 19 to allow the readout circuit 19 to read out a voltage level of a potential at the storage gate 13. Thus, the storage gate 13 serves for both charge storage and for allowing for a charge signal to be read out of the pixel 7.

The second transfer gate 14 is located on an opposite side of the storage gate 13 relative to the first transfer gate 12, such that the storage gate 13 is located between the first transfer gate 12 and the second transfer gate 14. The storage gate 13 is charge coupled to the first transfer gate 12, and the storage gate 13 is also charge coupled to the second transfer gate 14. The anti-blooming gate 15 is located on an opposite side of the photodiode 11 relative to the first transfer gate 12. The anti-blooming gate 15 is connected to receive an anti-blooming control signal (AB), and the anti-blooming gate 15 is controllable by the anti-blooming control signal AB to allow for charge to be drained from the photodiode 11 to the drain diffusion 51.

A first terminal of the reset transistor 16 is connected to a reset voltage source that provides a reset voltage (Vrst). A gate of the reset transistor 16 is connected to receive a reset control signal (RST). A second terminal of the reset transistor 16 is connected to the storage gate 13 and to a gate of the source follower transistor 17. Thus, the reset transistor 16 is connected between the reset voltage source that provides the reset voltage Vrst and the storage gate 13. The gate of the source follower transistor 17 is connected to the storage gate 13 and to the second terminal of the reset transistor 16. In the embodiment shown in FIG. 1, the storage gate 13 is directly connected to the gate of the source follower transistor 17. A first terminal of the source follower transistor 17 is connected to a voltage source that supplies a voltage (Vdd).

A second terminal of the source follower transistor 17 is connected to a first terminal of the read select transistor 18. A gate of the read select transistor 18 is connected to receive a row select signal (ROW). A second terminal of the read select transistor 18 is connected to the readout line 53 for providing a pixel output signal (pout) for the pixel 7 on the readout line 53. Thus, the read select transistor 18 is connected between the source follower transistor 17 and the readout line 53. In the embodiment shown in FIG. 1, the readout circuit 19 includes the source follower transistor 17 and the read select transistor 18 for reading out a signal based on a voltage level of a potential at the storage gate 13. It should be appreciated that, in various other embodiments, the readout circuit 19 may have various other circuit structures that still provide for reading out a signal based on a voltage level of a potential at the storage gate 13. In various embodiments, the pixel 7 is used as a shutter pixel.

Figure 2:
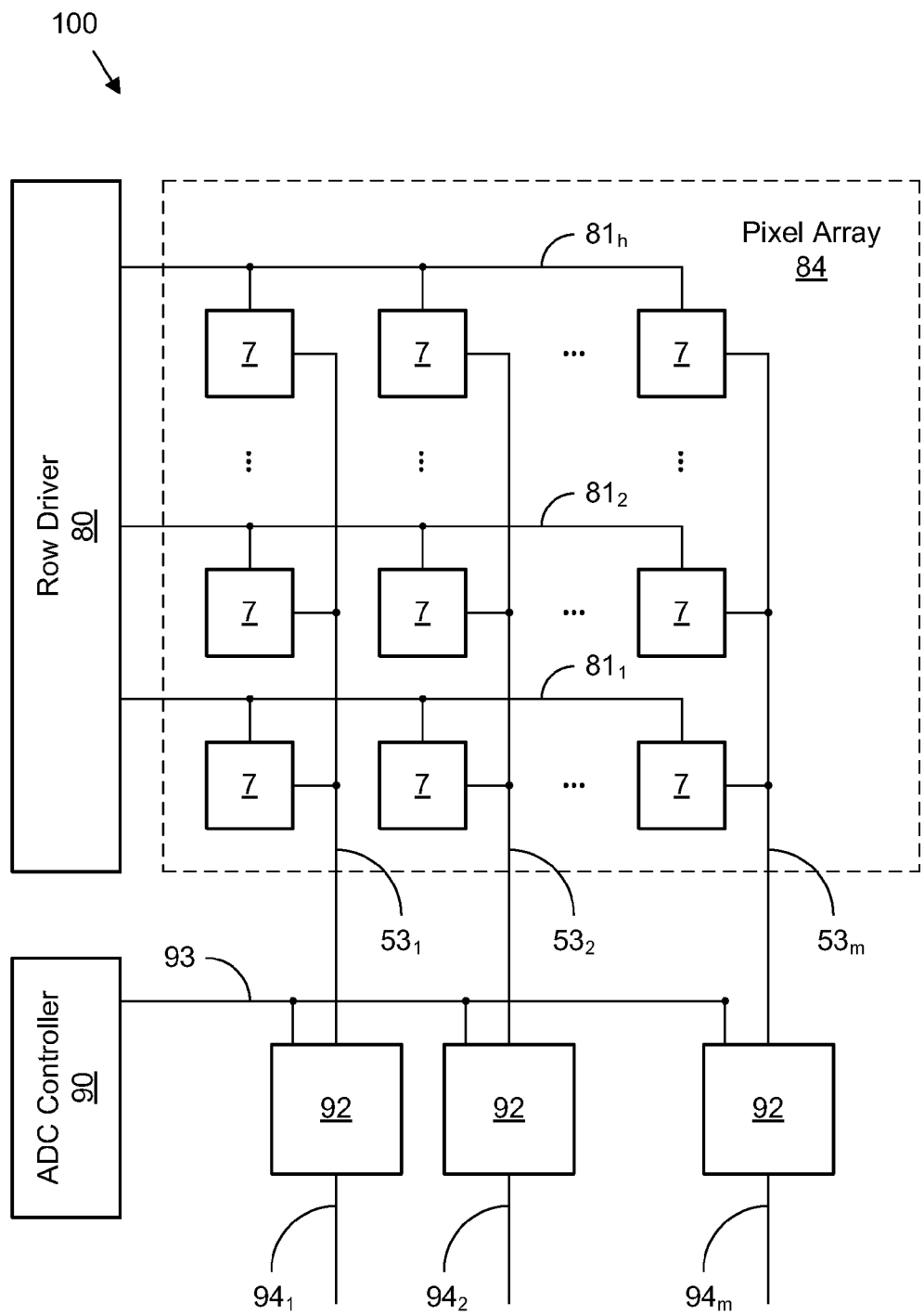
FIG. 2 illustrates an image sensor in accordance with an embodiment of the present invention.

FIG. 2 illustrates an architecture of an image sensor 100 in accordance with an embodiment of the present invention. The image sensor 100 comprises a pixel array 84, a row driver 80, an analog-to-digital conversion (ADC) controller 90, and a plurality of column readout circuits 92. The pixel array 84 comprises pixels 7 that are arranged in rows and columns, and each of the pixels 7 has a same structure as the pixel 7 shown in FIG. 1. With reference to FIGS. 1 and 2, the row driver 80 supplies control signals to the pixels 7 in the pixel array 84 to control an operation of the pixels 7. Pixels 7 that are in a same row of the pixel array 84 share common row control signals from the row driver 80.

For example, pixels 7 in a first row of the pixel array 84 share common row control lines $81_1$ for receiving control signals from the row driver 80. The row control lines $81_1$ may include signal lines for the first transfer control signal TX, the second transfer control signal TX2, the anti-blooming control signal AB, the reset control signal RST, and the row select signal ROW for the pixels 7 in the first row of the pixel array 84, and the row driver 80 may be configured to generate each of those signals. Similarly, pixels 7 in a second row of the pixel array 84 share common row control lines $81_2$ for receiving control signals from the row driver 80, and pixels 7 in an $h^{th}$ row of the pixel array 84 share common row control lines $81_h$ for receiving control signals from the row driver 80.

Pixels 7 that are in a same column of the pixel array 84 may share a common readout line to provide output. For example, pixels 7 in a first column of the pixel array 84 share a readout line 53$_k$, pixels 7 in a second column of the pixel array 84 share a readout line 53$_2$, and pixels 7 in an m$^{th}$ column of the pixel array 84 share a readout line 53$_m$. In various embodiments, the row driver 80 controls the pixels 7 to provide output row by row. Also, in various embodiments, the row driver 80 controls the pixels 7 to output signals representing charge stored at the pixels 7 for an image capture operation and to output reference signals after charge has been drained in the pixels 7.

In various embodiments, each column readout circuit 92 is connected to receive analog signals from a corresponding readout line from the pixel array 84, and is configured to provide digital output on a corresponding output line. For example, the column readout circuit 92 for the first column is connected to the readout line 53$_1$ for receiving input, and is connected to an output line 94$_1$ for providing output. Similarly, the column readout circuit 92 for the second column is connected to the column readout line 53$_2$ for receiving input, and is connected to an output line 94$_2$ for providing output, and the column readout circuit 92 for the m$^{th}$ column is connected to the column readout line 53$_m$, for receiving input, and is connected to an output line 94$_m$, for providing output. The ADC controller 90 is configured to provide control signals to the plurality of column readout circuits 92 over one or more control lines 93.

Figure 3:
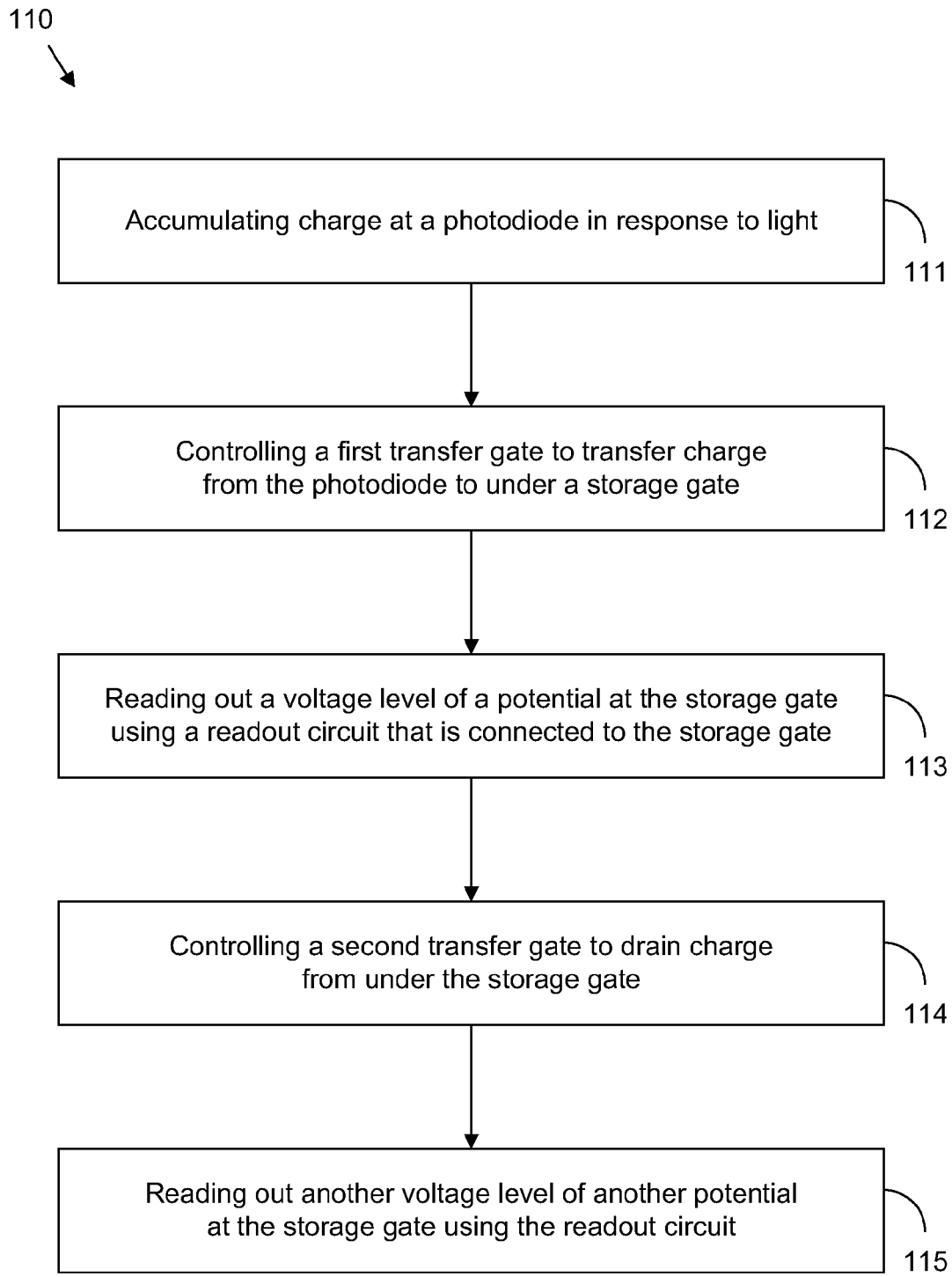
FIG. 3 illustrates a flowchart of a method in accordance with an embodiment of the present invention.

FIG. 3 illustrates a flowchart of a method 110 performed by a pixel, such as the pixel 7 of FIG. 1, in accordance with an embodiment of the present invention. With reference to FIGS. 1 and 3, the method 110 starts with an exposure mode (which may also be called a photo-charge charge integration mode) at step 111 in which charge is accumulated at the photodiode 11 in response to light. In the exposure mode, the first transfer control signal TX to the first transfer gate 12 is controlled to be a LOW voltage so that photoelectrons can be contained in the photodiode 11. During the exposure mode, photogenerated carriers diffuse or drift from the substrate 10 to the photodiode 11, which is a buried photodiode, and charge accumulates at the photodiode 11. Following the exposure mode, the method 110 then continues to a transfer mode in step 112.

In the transfer mode in step 112, the first transfer gate 12 is controlled to transfer charge from the photodiode 11 to under the storage gate 13. For the transfer mode, the first transfer control signal TX to the first transfer gate 12 is controlled to be a HIGH voltage, and the second transfer control signal TX2 to the second transfer gate 14 is controlled to be a LOW voltage. Also, during the transfer mode, a HIGH voltage is applied to the storage gate 13 by controlling the reset control signal RST that is applied to the gate of the reset transistor 16 to be a HIGH voltage, such that the HIGH voltage of Vrst goes to the storage gate 13. In various embodiments, the transfer mode may be performed globally at a same time on all pixels in an entire pixel array that includes the pixel 7. During the transfer mode (which may also be called a transfer phase), charges from the photodiode 11 flow through a channel under the first transfer gate 12 to under the storage gate 13, such that charge that was accumulated at the photodiode 11 during the exposure mode is stored under the storage gate 13. The transfer mode is ended by controlling the first transfer control signal TX that is applied to the first transfer gate 12 to be a LOW voltage.

After the transfer mode, the method 110 continues to step 113 to start a readout from the pixel 7. The reset control signal RST that is applied to the gate of the reset transistor 16 is controlled to be a LOW voltage so as to turn off the reset transistor 16. Once the reset transistor 16 has been turned off, the storage gate 13 becomes a floating gate. A voltage level of a potential at the storage gate 13 is then read out using the readout circuit 19 that is connected to the storage gate 13. To perform the read out, the row select signal ROW that is applied to the gate of the read select transistor 18 is controlled to be a HIGH voltage, which causes a signal representing the voltage level of the potential at the storage gate 13 to be output from the pixel 7 on the readout line 53. Such an output signal allows for a column storage (not shown), which may be part of a corresponding column readout circuit 92 (refer to FIG. 2), to measure and store the voltage level corresponding to the potential at the storage gate 13 when the storage gate 13 is "with charge." The signal is read out through the source follower transistor 17 and the read select transistor 18 loaded onto a source follower current sink (not shown), where the source follower current sink may also be part of the corresponding column readout circuit 92 (refer to FIG. 2). The method 110 then continues to step 114.

In step 114, the second transfer gate 14 is controlled to drain charge from under the storage gate 13. The second transfer control signal TX2 that is applied to the second transfer gate 14 is controlled to be a HIGH voltage. Charges from under the storage gate 13 then flow through a channel under the second transfer gate 14 and are drained into the drain diffusion 52 that is connected to Vdd. In the pixel 7, charge from under the storage gate 13 is transferred directly through a channel under the second transfer gate 14 to the drain diffusion 52 when the HIGH voltage is applied to the second transfer gate 14.

The method 110 then continues to step 115, in which another voltage level of another potential at the storage gate 13 is read out using the readout circuit 19. The row select signal ROW that is applied to the gate of the read select transistor 18 is controlled to be a HIGH voltage, which causes a signal representing the voltage level of the potential at the storage gate 13 to be output from the pixel 7 on the readout line 53. Such an output signal allows for a column storage (not shown), which may be part of the corresponding column readout circuit 92 (refer to FIG. 2), to measure and store the voltage level corresponding to the potential at the storage gate 13 after charge has been drained from the storage gate 13. The output signal can thus serve as a reference signal for a voltage level of a potential at the storage gate 13 when the storage gate 13 supposedly has "no charge."

The corresponding column readout circuit 92 (refer to FIG. 2) may then determine a difference between the previously stored output signal representing the "with charge" state and the reference signal representing the "no charge" state, and may use the difference to generate a digital value for the pixel output. The difference does not have kTC noise of a capacitance of the storage gate 13, so the difference represents a true correlated double sampling and features low noise. The method 110 may then be repeated to capture additional images.

In various embodiments of the method 110, after the transfer of charge to under the storage gate 13 in step 112, the charge transferred to under the storage gate 13 from the photodiode 11 is stored under the storage gate 13 during the reading out of the voltage level in step 113. In some embodiments, the voltage at the storage gate 13 may be reduced in a storage mode to reduce dark current and to squeeze out excessive charge. In some embodiments, the anti-blooming gate 15 may be controlled to drain excessive charge from the photodiode 11 if desired into the drain diffusion 51 that is connected to Vdd. With reference to FIGS. 1, 2, and 3, in various embodiments, the readout from the pixels 7 in the pixel array 84 may be performed row by row using steps 113, 114, and 115 of the method 110 after all charges are stored under the storage gate 13 of each pixel 7 over the entire pixel array 84, such that the voltage levels for charges can be read out row by row. In various embodiments, to perform readout for a selected row, a HIGH voltage would be provided to the row select signal ROW for the row.

Figure 4:
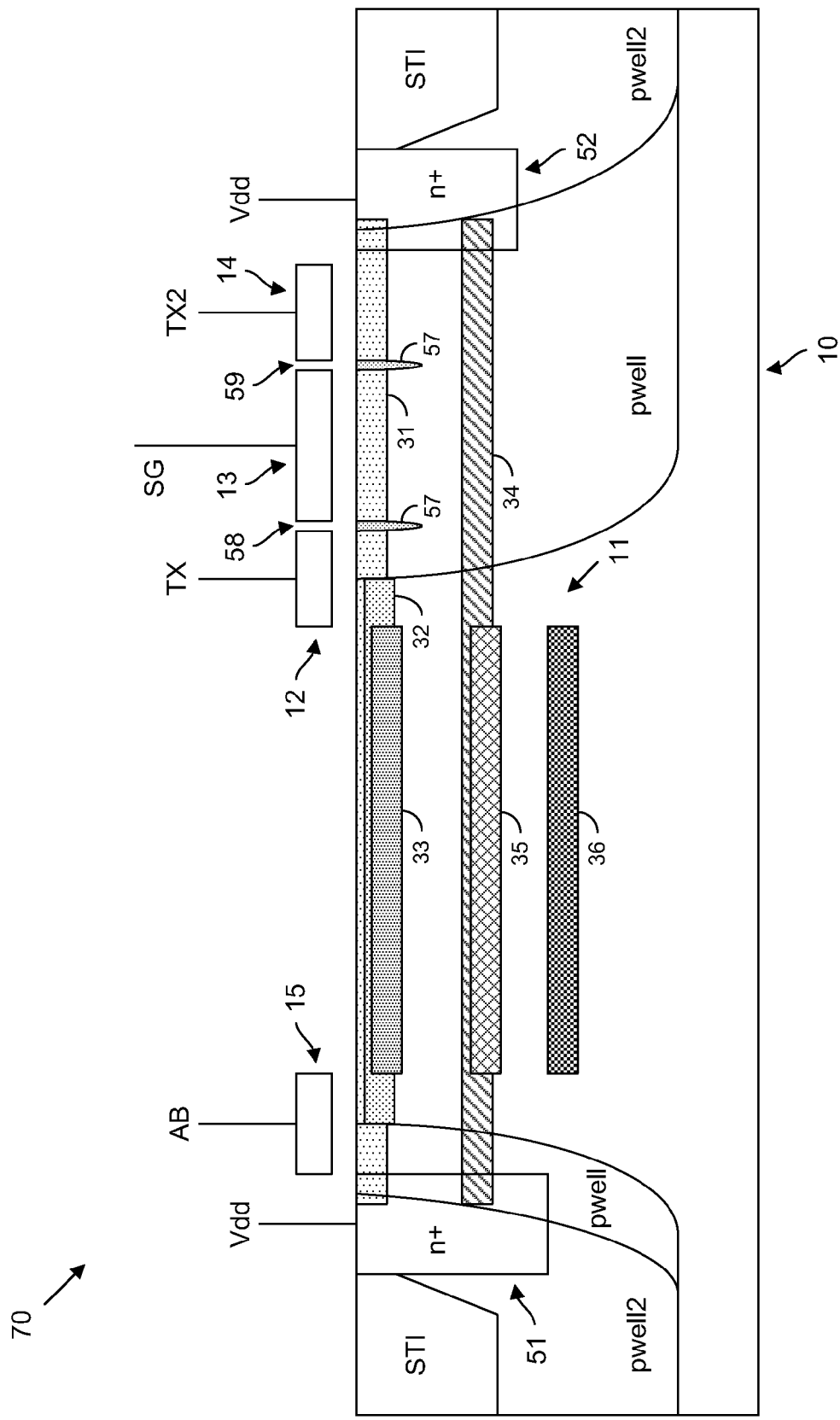
FIG. 4 illustrates a portion of a pixel in accordance with an embodiment of the present invention.

FIG. 4 illustrates a portion 70 of the pixel 7 of FIG. 1 in accordance with an embodiment of the present invention. In various embodiments, the substrate 10 comprises a lightly doped P-type epi-layer on a P+ substrate. Exemplary implants in the substrate 10 are shown in FIG. 4, and the exemplary implants are as follows: (i) a surface blanket BF2 pinned implant 31 before polysilicon; (ii) a pwell aligned VT compensation BF2 pinned implant 32 before polysilicon; (iii) a photodiode BF2 pinned implant 33 at lightly doped drain (LDD) stage; (iv) a blanket arsenic (AS) buried channel implant 34 before polysilicon; (v) a photodiode AS implant 35 at LDD stage; and (vi) a backside boron implant 36 at LDD stage. In various embodiments, the photodiode 11 is implemented as a pinned photodiode with a surface BF2 implant and a buried AS75 implant.

In various embodiments, the first transfer gate 12, the storage gate 13, the second transfer gate 14, and the anti-blooming gate 15 are formed on the substrate 10. Also, in various embodiments, the first transfer gate 12, the storage gate 13, and the second transfer gate 14 are polysilicon gates that are implemented in a single polysilicon level with minimum gap between the polysilicon gates. The portion 70 of the pixel includes separate storage and transfer gates, where the storage gate 13 is distinct from the first transfer gate 12 and is distinct from the second transfer gate 14. The storage gate 13 is charge coupled to the first transfer gate 12 and is also charge coupled to the second transfer gate 14. In some embodiments, a gap implant 57 is provided into gaps 58, 59 between the storage gate 13 and the first transfer gate 12, and between the storage gate 13 and the second transfer gate 14. The gap implant 57 may be arsenic if the storage gate 13 is a surface channel storage gate, and may be arsenic or boron if the storage gate 13 is a buried channel storage gate. The purpose of the gap implant 57 is to reduce a potential barrier in the substrate 10 between the gates, and it fixes imperfections of other implants in the gap area. The gap implant 57 is implanted from the top of the structure down into the substrate 10, and the polysilicon gates serve as a mask so that the gap implant only gets into and through the gaps 58, 59.

In various embodiments, the surface blanket BF2 pinned implant 31 is done as a blanket implant before Poly deposition, and it covers an area of the photodiode 11, the first transfer gate 12, the storage gate 13, the second transfer gate 14, and the anti-blooming gate 15. Thus, in various embodiments, the surface blanket BF2 pinned implant 31 is implemented on the substrate 10 before polysilicon and covers areas of the first transfer gate 12, the storage gate 13, and the second transfer gate 14. Also, in various embodiments, the photodiode 11 includes a portion of the surface blanket BF2 pinned implant 31.

In various embodiments, the pwell aligned VT compensation BF2 pinned implant 32 is also done before Poly deposition and it covers the photodiode 11, a portion of area under the first transfer gate 12, and a portion of area under the anti-blooming gate 15. In various embodiments, the photodiode BF2 pinned implant 33 is done after Poly formation and it covers an area of the photodiode 11 only. The pwell aligned VT compensation BF2 pinned implant 32 overlaps part of the surface blanket BF2 pinned implant 31. The photodiode BF2 pinned implant 33 overlaps part of the pwell aligned VT compensation BF2 pinned implant 32 and part of the surface blanket BF2 pinned implant 31. The three BF2 implants may be done one after another, so that the doses of the implants add in the overlap places which have already been implanted. In FIG. 4, the surface blanket BF2 pinned implant 31, the pwell aligned VT compensation BF2 pinned implant 32, and the photodiode BF2 pinned implant 33 are shown a little staggered from each other in the depth direction so that each of the implants is visible, but it should be appreciated that in various embodiments each of those implants starts at the surface of the substrate 10 and has approximately a same depth.

The photodiode area is implanted with arsenic implant to form a buried photodiode. In various embodiments, the portion 70 of the pixel includes the blanket arsenic buried channel implant 34 on the substrate 10, which is done before Poly deposition and which covers the areas of the photodiode 11, the first transfer gate 12, the storage gate 13, the second transfer gate 14, and the anti-blooming gate 15. Thus, in various embodiments, the photodiode 11 includes a portion of the blanket arsenic buried channel implant 34. The photodiode AS implant 35 overlaps the blanket arsenic buried channel implant 34 in the area of the photodiode 11, and the doses of the implants add in the overlap. In FIG. 4, the blanket arsenic buried channel implant 34 and the photodiode AS implant 35 are shown a little staggered from each other in the depth direction so that each of the implants is visible, but it should be appreciated that in various embodiments each of those implants starts at approximately a same depth and continues to approximately a same depth. In some embodiments, the photodiode 11 includes the backside boron implant 36 to increase a charge capacity of the photodiode 11.

In various embodiments, the portion 70 of the pixel includes a Pwell implant or series of Pwell implants covering the storage area to reduce the leakage of a photocurrent from the substrate 10 into the area under the storage gate 13, thereby increasing the shutter efficiency. Another function of Pwell implants is to perform pixel-to-pixel isolation and crosstalk reduction. In various embodiments, each Pwell implant is a combination of Boron and BF2 implants of various energy and dose. In some embodiments, the surface blanket BF2 pinned implant 31 and the blanket arsenic buried channel implant 34 are not implemented, thereby the storage gate 13 performs as a surface channel storage. In some embodiments, the storage gate 13 is implemented as a buried channel device, with a surface boron implant and a buried arsenic or phosphorous implant.

Figure 5:
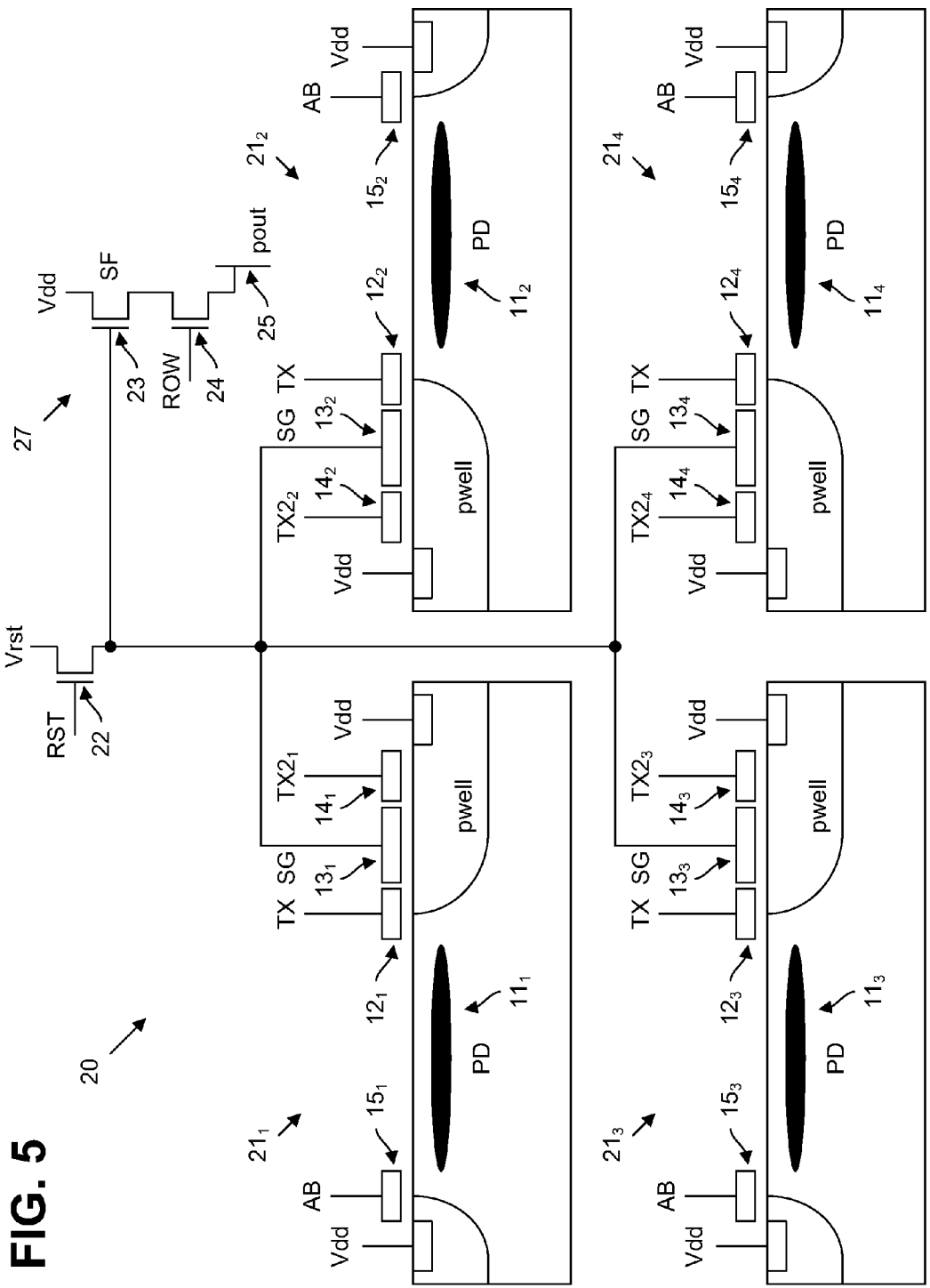
FIG. 5 illustrates a circuit in accordance with an embodiment of the present invention with four pixels that share a readout circuit.

FIG. 5 illustrates a circuit 20 in accordance with an embodiment of the present invention. The circuit 20 includes four pixels $21_1$, $21_2$, $21_3$, $21_4$, with structures similar to the pixel 7 (refer to FIG. 1), but the four pixels $21_1$, $21_2$, $21_3$, $21_4$, share a common reset transistor 22 and a common readout circuit 27. Thus, the four pixels $21_1$, $21_2$, $21_3$, $21_4$, share pixel readout elements. Each pixel $21_i$ comprises a photodiode $11_i$, a first transfer gate $12_i$, a storage gate $13_i$, a second transfer gate $14_i$, and an anti-blooming gate $15_i$ (i=1, 2, 3, 4). The readout circuit 27 comprises a source follower transistor 23 and a read select transistor 24. The readout circuit 27 is connected to a readout line 25 to provide output from the pixels.

A first terminal of the reset transistor 22 is connected to a reset voltage source that provides a reset voltage Vrst. A gate of the reset transistor 22 is connected to receive a reset control signal RST. A second terminal of the reset transistor 22 is connected to each of the storage gates $13_1$, $13_2$, $13_3$, $13_4$, and to a gate of the source follower transistor 23. The gate of the source follower transistor 23 is connected to each of the storage gates $13_1$, $13_2$, $13_3$, $13_4$, and to the second terminal of the reset transistor 22. A first terminal of the source follower transistor 23 is connected to a voltage source that supplies a voltage Vdd. A second terminal of the source follower transistor 23 is connected to a first terminal of the read select transistor 24. A gate of the read select transistor 24 is connected to receive a row select signal ROW. A second terminal of the read select transistor 24 is connected to the readout line 25.

Each of the pixels is connected to receive a first transfer control signal TX, a corresponding second transfer control signal $TX2_i$ (i=1, 2, 3, 4), and an anti-blooming control signal AB. The pixels $21_1$, $21_2$, $21_3$, $21_4$, are read out in order, and the readout operations for each of the pixels $21_1$, $21_2$, $21_3$, $21_4$, is similar to the readout described for the method 110 (refer to FIG. 3). The storages under the storage gates $13_1$, $13_2$, $13_3$, $13_4$, are emptied one by one using four separate controls $TX2_1$, $TX2_2$, $TX2_3$, $TX2_4$, to the respective second transfer gates $14_1$, $14_2$, $14_3$, $14_4$.

In various embodiments, the operation of the circuit 20 is as follows. Photocharge is accumulated in each of the photodiodes $11_1$, $11_2$, $11_3$, $11_4$. An exposure time is controlled with the anti-blooming gates $15_1$, $15_2$, $15_3$, $15_4$. The exposure starts with controlling the anti-blooming control signal AB to be LOW. When the anti-blooming control signal AB is controlled to be HIGH, photodiode charges are drained out through the respective anti-blooming gates $15_1$, $15_2$, $15_3$, $15_4$. The exposure ends with a transfer of charge from all of the photodiodes $11_1$, $11_2$, $11_3$, $11_4$ to the corresponding storage gates $13_1$, $13_2$, $13_3$, $13_4$ through global transfer by controlling the first transfer control signal TX to apply HIGH to all first transfer gates $12_1$, $12_2$, $12_3$, $12_4$. The storage gates $13_1$, $13_2$, $13_3$, $13_4$ during the transfer are kept at a DC voltage through connected reset transistor 22 by controlling the reset control signal RST to be HIGH. The charge from each of the photodiodes $11_1$, $11_2$, $11_3$, $11_4$ is stored under the respective storage gates $13_1$, $13_2$, $13_3$, $13_4$.

The readout is done in the group of four pixels $21_1$, $21_2$, $21_3$, $21_4$ one-by-one. The combined storage gate of the four pixels $21_1$, $21_2$, $21_3$, $21_4$ is reset by controlling the reset control signal RST to be HIGH and then is left floating by controlling the reset control signal RST to be LOW. The floating potential is then measured using the readout circuit 27. The charge from the first pixel $21_1$ is then dumped to the drain by controlling the corresponding second transfer control signal $TX2_1$ applied to the second transfer gate $14_1$ to be HIGH. A second potential is then measured using the readout circuit 27, which corresponds to the charge gone.

The combined storage gate of the four pixels $21_1$, $21_2$, $21_3$, $21_4$ is reset again by controlling the reset control signal RST to be HIGH and then is left floating by controlling the reset control signal RST to be LOW. The floating potential of the floating combined gate is then measured using the readout circuit 27. The charge from the second pixel $21_2$ is then dumped to the drain by controlling the corresponding second transfer control signal $TX2_2$ applied to the second transfer gate $14_2$ to be HIGH. A second potential is then measured using the readout circuit 27, which corresponds to the charge left from under the storage gate $13_2$. The readout is then repeated for the pixel $21_3$ and the pixel $21_4$, so that all four charges are read out.

The embodiment shown in FIG. 5 is a 4-share architecture in which the pixel readout elements are shared by four neighboring pixels. In various other embodiments, different numbers of pixels may share pixel readout elements. For example, a circuit may be constructed in a 2-share architecture in which pixel readout elements are shared by two neighboring pixels. In various embodiments, an image sensor includes a pixel array with pixels in 2-share or 4-share architectures, such that the respective storage gates of two or more of the pixels in the pixel array are directly connected to a same readout circuit. In such embodiments, a voltage level of a potential at a storage gate of a first pixel may be read out using a readout circuit that is connected to the storage gate of the first pixel, and the same readout circuit may also be used to read out another voltage level of another potential at a storage gate of a second pixel.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. Various modifications and changes that come within the meaning and range of equivalency of the claims are intended to be within the scope of the invention.

What is claimed is:

1. A pixel, comprising:
   a readout circuit;
   a storage gate that is connected to the readout circuit to allow the readout circuit to read out a voltage level of a potential at the storage gate;
   a first transfer gate controllable to transfer charge from a photodiode to under the storage gate;
   a second transfer gate controllable to transfer charge from under the storage gate; and
   a drain diffusion to which charge is drainable from under the storage gate by the second transfer gate, the drain diffusion directly connected to a voltage source that supplies a constant voltage.

2. A pixel, comprising:
   a storage gate that is connected to a readout circuit to allow the readout circuit to read out a voltage level of a potential at the storage gate;
   a first transfer gate controllable to transfer charge from a photodiode to under the storage gate;
   a second transfer gate controllable to transfer charge from under the storage gate; and
   a reset transistor that is connected between a reset voltage source and the storage gate and that has a gate connected to receive a reset control signal.

3. The pixel of claim 2, further comprising an anti-blooming gate for draining charge from the photodiode into a drain diffusion, the anti-blooming gate located on an opposite side of the photodiode relative to the first transfer gate.

4. The pixel of claim 2, further comprising a substrate on which is the first transfer gate, the storage gate, and the second transfer gate.

5. The pixel of claim 2, wherein the storage gate, the first transfer gate, and the second transfer gate are polysilicon gates that are in a single polysilicon level.

6. The pixel of claim 2, the first transfer gate connected to receive a first transfer control signal and the second transfer gate connected to receive a second transfer control signal.

7. A pixel, comprising:
   a storage gate that is connected to a readout circuit to allow the readout circuit to read out a voltage level of a potential at the storage gate;
   a first transfer gate controllable to transfer charge from a photodiode to under the storage gate;
   a second transfer gate controllable to transfer charge from under the storage gate; and
   a gap implant between the storage gate and the first transfer gate and between the storage gate and the second transfer gate, the gap implant comprising arsenic or boron.

8. A pixel, comprising:
   a storage gate that is connected to a readout circuit to allow the readout circuit to read out a voltage level of a potential at the storage gate;
   a first transfer gate controllable to transfer charge from a photodiode to under the storage gate;
   a second transfer gate controllable to transfer charge from under the storage gate; and
   a surface blanket BF2 implant on a substrate implemented before polysilicon and covering areas of the first transfer gate, the storage gate, and the second transfer gate.

9. The pixel of claim 8, wherein the photodiode includes a portion of the surface blanket BF2 implant.

10. A pixel, comprising:
   a storage gate that is connected to a readout circuit to allow the readout circuit to read out a voltage level of a potential at the storage gate;
   a first transfer gate controllable to transfer charge from a photodiode to under the storage gate;
   a second transfer gate controllable to transfer charge from under the storage gate; and
   a blanket arsenic buried channel implant implemented before polysilicon and covering areas of the first transfer gate, the storage gate, and the second transfer gate.

11. The pixel of claim 10, wherein the photodiode includes a portion of the blanket arsenic buried channel implant.

12. A method, comprising:
   controlling a first transfer gate to transfer charge from a photodiode to under a storage gate;
   reading out a voltage level of a potential at the storage gate using a readout circuit that is connected to the storage gate;
   controlling a second transfer gate to drain charge from under the storage gate; and
   reading out another voltage level of another potential at the storage gate using the readout circuit after said controlling the second transfer gate to drain charge from under the storage gate and before controlling the first transfer gate again to transfer other charge from the photodiode to under the storage gate.

13. The method of claim 12, the second transfer gate located on an opposite side of the storage gate relative to the first transfer gate.

14. The method of claim 12, further comprising controlling an anti-blooming gate to drain charge from the photodiode, the anti-blooming gate located on an opposite side of the photodiode relative to the first transfer gate.

15. The method of claim 12, wherein charge transferred to under the storage gate from the photodiode is stored under the storage gate during said reading out of the voltage level of the potential at the storage gate.

16. The method of claim 12, further comprising generating a digital value based on a difference between said voltage level and said another voltage level.

17. The method of claim 12,
   wherein charge from under the storage gate is transferred directly though a channel under the second transfer gate to a drain diffusion during said controlling the second transfer gate to drain charge from under the storage gate; and
   wherein the drain diffusion is directly connected to a voltage source that supplies a constant voltage.

18. The method of claim 12, wherein the readout circuit reads out voltage levels from a first pixel, and the readout circuit also reads out voltage levels from a second pixel that is in a different row and a different column of a pixel array than a row and column of the first pixel.

19. An image sensor, comprising:
   a pixel array comprising a plurality of pixels, each pixel of the plurality of pixels comprising a photodiode, a storage gate, a readout circuit, a first transfer gate controllable to transfer charge from the photodiode to under the storage gate, and a second transfer gate controllable to transfer charge from under the storage gate;
   each storage gate of each pixel connected to the readout circuit of the pixel to allow the readout circuit of the pixel to read out a voltage level of a potential at the storage gate wherein each pixel of the plurality of pixels further comprising a drain diffusion that is directly connected to a voltage source that supplies a constant voltage and to which charge is drainable from under the storage gate of the pixel by the second transfer gate of the pixel.

20. A method, comprising:
   controlling a first transfer gate to transfer charge from a photodiode to under a storage gate;
   reading out a voltage level of a potential at the storage gate using a readout circuit that is connected to the storage gate;
   controlling a second transfer gate to drain charge from under the storage gate; and
   controlling a reset control signal that is applied to a gate of a reset transistor in order to reset the storage gate prior to said reading out the voltage level of the potential at the storage gate.

21. A method, comprising:
   controlling a first transfer gate to transfer charge from a photodiode to under a storage gate;
   reading out a voltage level of a potential at the storage gate using a readout circuit that is connected to the storage gate;
   controlling a second transfer gate to drain charge from under the storage gate;
   reading out another voltage level of another potential at the storage gate using the readout circuit after said controlling the second transfer gate to drain charge from under the storage gate;
   controlling a reset control signal that is applied to a gate of a reset transistor in order to reset the storage gate after said reading out of said another voltage level; and
   reading out a particular voltage level of a particular potential at the storage gate using the readout circuit after said controlling the reset control signal that is applied to the gate of the reset transistor.

22. The method of claim 21, further comprising controlling the second transfer gate to drain charge from under the storage gate after said reading out the particular voltage level of the particular potential at the storage gate, and then reading out a specific voltage level of a specific potential at the storage gate using the readout circuit.

* * * * *

UNITED STATES PATENT AND TRADEMARK OFFICE
CERTIFICATE OF CORRECTION

| | |
|---|---|
| PATENT NO. | : 8,698,061 B2 |
| APPLICATION NO. | : 12/963566 |
| DATED | : April 15, 2014 |
| INVENTOR(S) | : Alexander Krymski |

It is certified that error appears in the above-identified patent and that said Letters Patent is hereby corrected as shown below:

In the Specification

Column 2, line 67: the word "though" should read --through--.

In the Claims

Claim 17, column 11, line 57: the word "though" should read --through--.

Signed and Sealed this
Twenty-eighth Day of April, 2015

Michelle K. Lee
*Director of the United States Patent and Trademark Office*